United States Patent
Kim et al.

(10) Patent No.: US 7,582,163 B2
(45) Date of Patent: Sep. 1, 2009

(54) APPARATUS FOR PROCESSING SURFACE OF SUBSTRATE

(75) Inventors: Tae-Gyu Kim, Hwaseong-si (KR); Tae-Sang Park, Suwon-si (KR)

(73) Assignee: Samsung Electronics Co., Ltd (KR)

( * ) Notice: Subject to any disclaimer, the term of this patent is extended or adjusted under 35 U.S.C. 154(b) by 0 days.

(21) Appl. No.: 11/157,522

(22) Filed: Jun. 21, 2005

(65) Prior Publication Data
US 2005/0284362 A1    Dec. 29, 2005

(30) Foreign Application Priority Data
Jun. 29, 2004  (KR) ............... 10-2004-0049274

(51) Int. Cl.
  *B05C 11/02*  (2006.01)
  *B05B 1/28*   (2006.01)
  *B05B 3/00*   (2006.01)
(52) U.S. Cl. ............... 118/52; 118/612; 118/326; 134/153; 134/198
(58) Field of Classification Search ............ 118/52, 118/612, 319, 320, 326, 305; 134/198, 153, 134/902; 396/604, 611, 627; 427/240, 350
See application file for complete search history.

(56) References Cited

U.S. PATENT DOCUMENTS 6,149,727 A * 11/2000 Yoshioka et al. ............ 118/500
6,533,864 B1 * 3/2003 Matsuyama et al. ......... 118/704
6,673,151 B2 * 1/2004 Yoshihara et al. ............ 118/50
6,745,784 B2 * 6/2004 Katakabe et al. ............ 134/153
2002/0027081 A1 * 3/2002 Nagai et al. .................. 205/157

FOREIGN PATENT DOCUMENTS

| JP | 09-010658 | | 1/1997 |
| JP | 09148218 A | * | 6/1997 |
| JP | 2001-189266 | | 7/2001 |
| JP | 2002-164281 | | 6/2002 |
| KR | 20-0222598 | | 2/2001 |

OTHER PUBLICATIONS

English Translated Abstract and detailed description of JP 09148218A (Jun. 6, 1997).*

* cited by examiner

*Primary Examiner*—Yewebdar T Tadesse
(74) *Attorney, Agent, or Firm*—The Farrell Law Firm, PC (57) ABSTRACT

A substrate surface processing apparatus is provided. In the substrate surface processing apparatus, a spin chuck holds a substrate thereon by suction, spins the substrate, and moves up and down the substrate. An upper bowl and a lower bowl surround the spin chuck for receiving a processing solution by which the surface of the substrate is processed. An air outlet is positioned under the lower bowl for exhausting air from the upper and lower bowls. A flow separation protrusion is formed within the upper bowl. It separates an air flow around the substrate into an upward air flow and a downward air flow and exhausts the downward air flow through the air outlet.

6 Claims, 8 Drawing Sheets

APPARATUS FOR PROCESSING SURFACE OF SUBSTRATE

PRIORITY

This application claims priority under 35 U.S.C. § 119 to an application entitled "Apparatus for Processing Surface of Substrate" filed in the Korean Intellectual Property Office on Jun. 29, 2004 and assigned Serial No. 2004-49274, the contents of which are incorporated herein by reference.

BACKGROUND OF THE INVENTION

1. Field of the Invention

The present invention generally relates to an apparatus for processing the surface of a substrate to be processed, and more particularly to processing a semiconductor wafer or a glass substrate through coating or cleaning.

2. Description of the Related Art

During fabrication of a semiconductor device, spin coating is typically performed in photolithography. The spin coating technique is the process of coating a high-viscosity solution like photoresist onto the surface of a substrate to be processed such as a wafer and forming a high-viscosity resin film on the substrate by spinning the coated substrate.

A substrate surface processing apparatus, which carries out the spin coating, controls the thickness of the photoresist layer by adjusting the spinning speed of the substrate and forms the thin film by spinning the wafer at high speed. The substrate surface processing apparatus also cleans the substrate by coating a cleaning solution onto the substrate.

Figure 1:
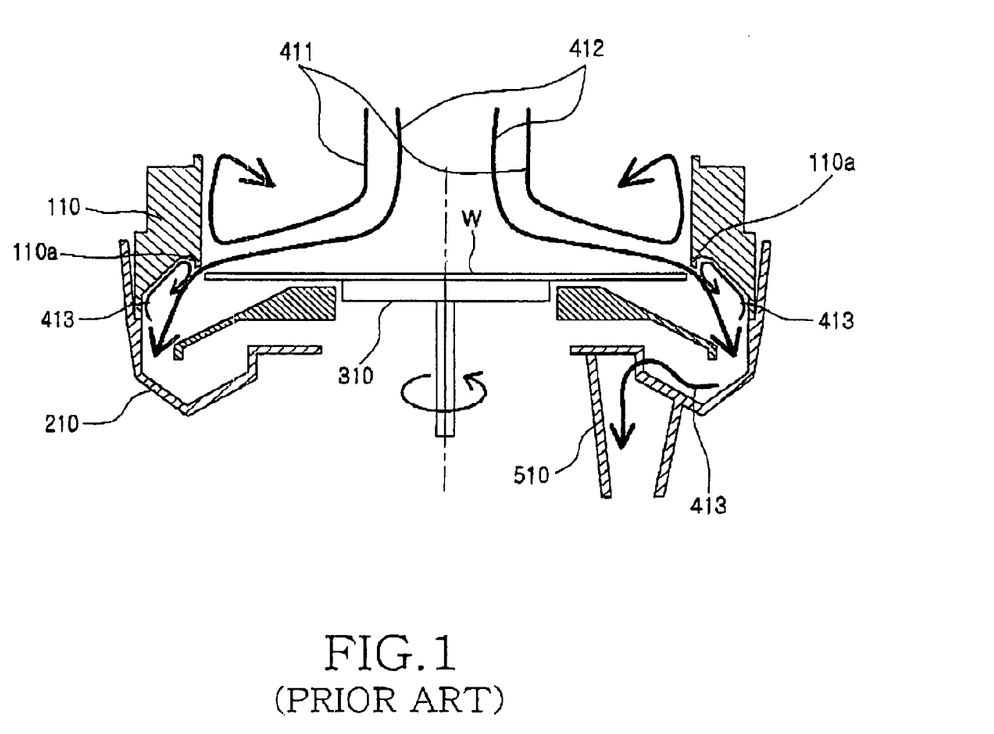
FIG. 1 is a sectional view illustrating major parts of a conventional substrate surface processing apparatus.

FIG. 1 is a sectional view illustrating major parts of a conventional substrate surface processing apparatus. Referring to FIG. 1, the substrate surface processing apparatus includes a spin chuck 310 for holding a substrate W thereon by suctioning, spinning, and moving up and down the substrate W, and upper and lower bowls 110 and 210 surrounding the spin chuck 310, for receiving a photoresist solution. An air outlet 510 is disposed under the lower bowl 210, for exhausting air from the bowls 110 and 210. The air outlet 510 is connected to an air pump (not shown) and air is forcedly exhausted from the bowls 110 and 210 through the air outlet 510 by the operation of the air pump. The substrate surface processing apparatus is further provided with a photoresist solution tank (not shown) and a supply nozzle (not shown), for supplying the photoresist solution onto the substrate W.

Because the substrate W is spun at a high speed (e.g. 1000 to 4000 rpm), a large amount of the photoresist solution is splashed out of the substrate W in the substrate surface processing apparatus. To prevent scattered fine particles of the photoresist solution from moving up to the upper bowl 110 and contaminating other devices, air is exhausted from the bowls 110 and 210 through the air outlet 510. The lower bowl 210 is shaped like a cup at its lower portion in order to receive the splashed photoresist solution.

As illustrated in FIG. 1, however, the substrate surface processing apparatus still faces the problem of particle contamination because photoresist particles bump against the upper bowl 110 and drop down onto the substrate W or fine photoresist particles fall onto the substrate W along air flows 411 and 413 that reflow from the inner walls of the bowls 110 and 210 during photoresist coating on the substrate W. Moreover, the splashed photoresist solution or particles stick to a lower end portion of the upper bowl 110, causing a so-called icicle phenomenon. Therefore, much time is taken to clean the bowls 110 and 210 regularly. In the context, studies are being conducted to provide an upper bowl flow control protrusion 110a at the lower end portion of the upper bowl 110 in order to appropriately control the air flows 411 and 412.

Figure 2:
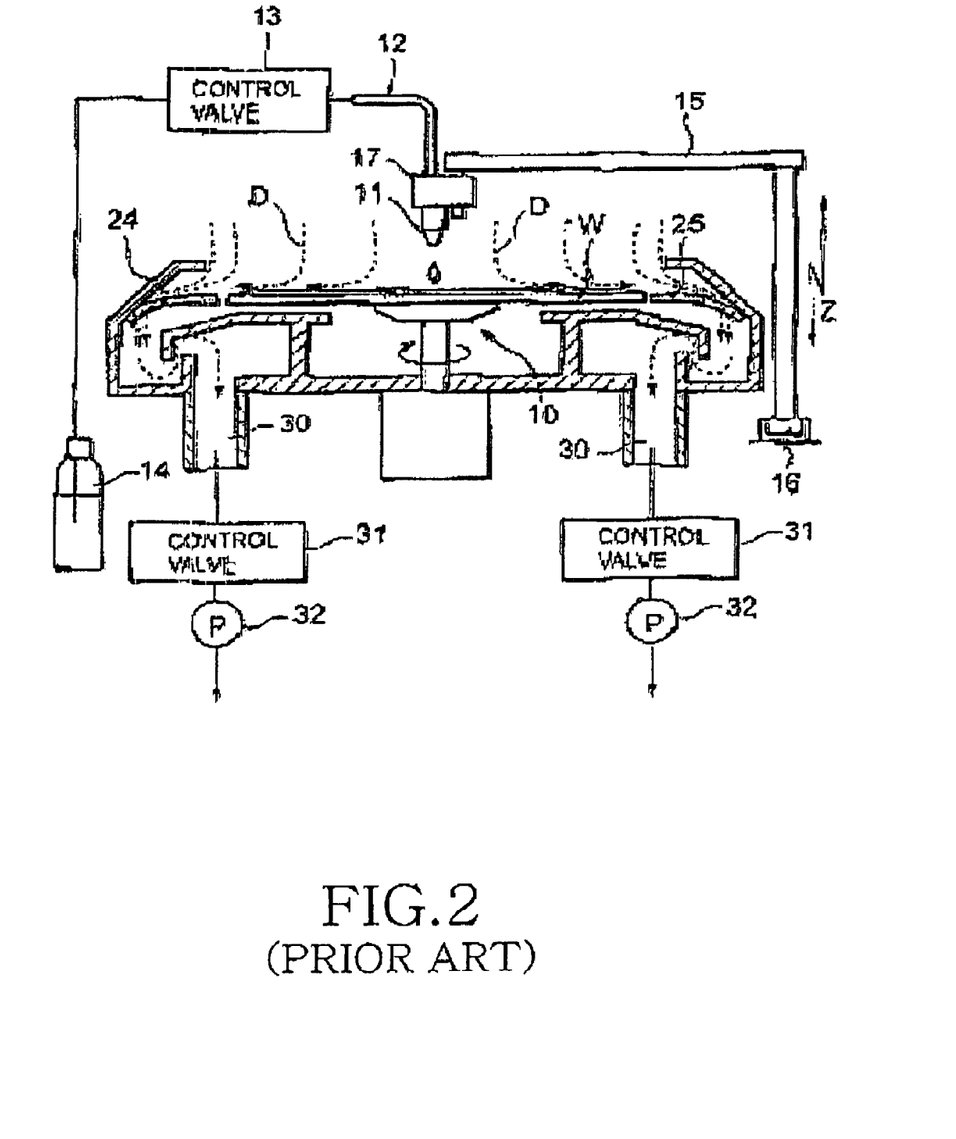
FIG. 2 is a sectional view illustrating a second conventional substrate surface processing apparatus.

FIG. 2 is a sectional view illustrating another conventional substrate surface processing apparatus, disclosed in Japanese Laid-Open Patent No. 2001-189266.

Referring to FIG. 2, the substrate surface processing apparatus includes a spin chuck 10 for spinning a wafer W thereon, and a supply nozzle 11, a supply pipe 12, a control valve 13, and a photoresist solution tank 14, for depositing a photoresist layer on the wafer W. The substrate surface processing apparatus is further provided with a holder 17, a Z-direction mover 16, and a Y-direction mover 15, for moving the supply nozzle 11 in the directions of Z and Y. A cup 24 surrounds the spin chuck 10 to receive the photo-resist solution splashed out due to the spinning of the wafer W, and an air flow control plate 25 of the substrate surface processing apparatus is installed at the gap between the wafer W and the inner circumferential surface of the cup 24. At the bottom of the cup 24 is disposed an air outlet 30. The air outlet 30 is connected to a pump 32 via a control valve 31. Air is forcedly exhausted from the cup 24 through the air outlet 30 by the pump 32. The resultant negative pressure occurred inside the cup 24 creates a downstream air flow D from up to down in the cup 24. The downstream air flow D flows to the bottom of the cup 24 through exhaust holes of the air flow control plate 25.

The substrate surface processing apparatus is provided with the air flow control plate 25 to prevent a rapid increase in the thickness of a photoresist layer caused by a change in the air flow around the wafer W. Since the distance between the edge of the wafer W and the air flow control plate 25 in the surface processing apparatus is relatively narrow and extra photoresist splashes over the air flow control plate 25, the photoresist solution may be still splashed back, an icicle may be still generated, and air may reflow around the air flow control plate 25.

Figure 3:
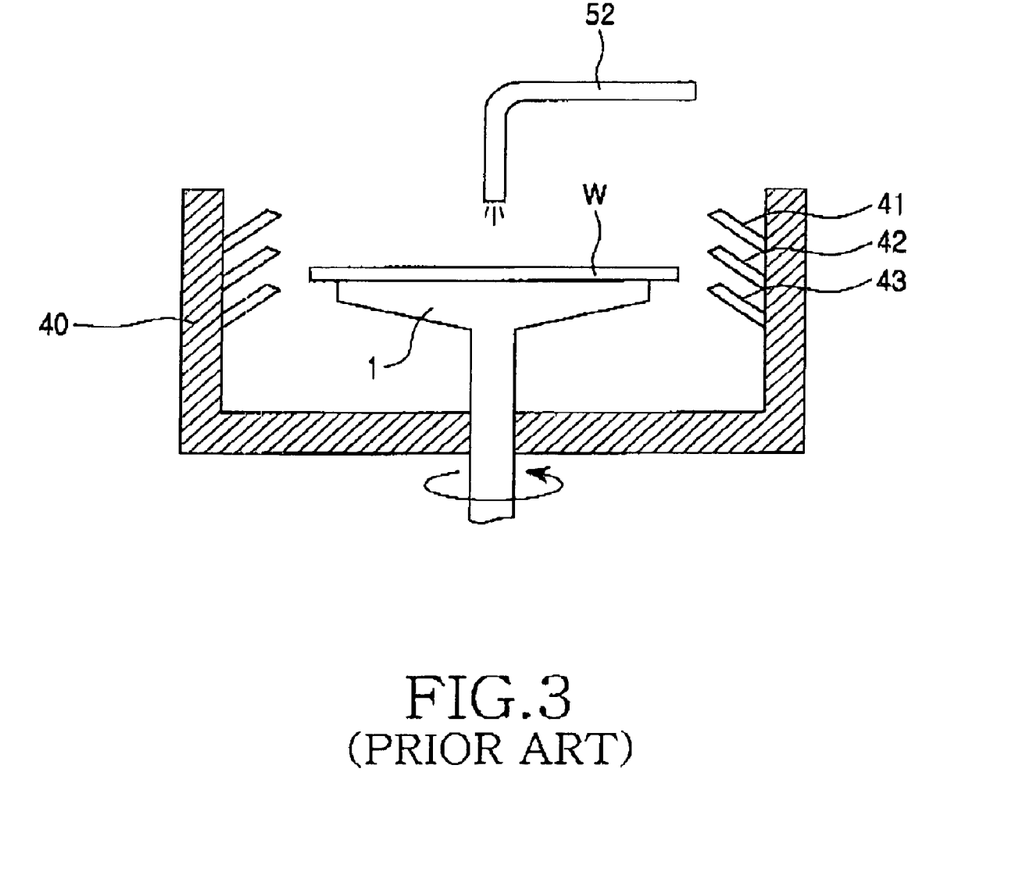
FIG. 3 is a sectional view illustrating a third conventional substrate surface processing apparatus.

FIG. 3 is a sectional view illustrating a third conventional substrate surface processing apparatus, disclosed in Korean Utility Model Registration No. 2002-22598. The substrate surface processing device includes a spin chuck 1 for spinning a wafer W thereon, a nozzle 52 for providing photoresist solution to the wafer W, and a cup-shaped case 40. A plurality of annular splash-back preventing portions 41, 42 and 43 are formed around the inner surface of the case 40 at different inclination angles, to thereby prevent the photoresist solution from splashing from the wafer W, bumping against the wall of the case 40, and then returning to the wafer W. However, the structure of the substrate surface processing apparatus also has limitations in its effectiveness to remove particle contamination, which is encountered as photoresist particles drop onto the wafer W along the air flow within the case 40.

Additionally, to prevent the photoresist solution from scattering or splashing back, a mesh or a net is provided within a bowl, a cover is provided on a bowl, or another air inlet is provided over a bowl so that a downstream air flow is formed which moves down along the inner bowl of the bowl and, in turn, extra photoresist solution may not stick to the inner wall of the bowl. Despite the above proposals, the particle contamination of the substrate is yet to be solved.

SUMMARY OF THE INVENTION

An object of the present invention is to solve at least the above problems and/or disadvantages and to provide at least the advantages below. Accordingly, an object of the present invention is to provide a substrate processing apparatus for effectively preventing a processing solution from splashing back and causing particle contamination during coating or cleaning a substrate to be processed.

In the substrate surface processing apparatus, a spin chuck holds a substrate thereon by suction, spins the substrate, and moves up and down the substrate. An upper bowl and a lower bowl surround the spin chuck for receiving a processing solution by which the surface of the substrate is processed. An air outlet is positioned under the lower bowl for exhausting air from the upper and lower bowls. A flow separation protrusion is formed within the upper bowl. It separates an air flow around the substrate into an upward air flow and a downward air flow and the downward air flow is exhausted through the air outlet.

The flow separation protrusion is ring-shaped around an inner wall of the upper bowl. A surface of the flow separation protrusion 100a facing the substrate is inclined at a predetermined angle, and the upper surface of the flow separation protrusion is less inclined than the lower surface thereof. The flow separation protrusion is a thin triangle having a vertex facing an outer-diameter edge of the substrate.

The vertex of the flow separation protrusion is spaced from the outer-diameter edge of the substrate by 7 to 11 mm, preferably 8 to 10 mm and higher than the upper surface of the substrate by 2 to 5 mm, preferably 3 to 4 mm.

The flow separation protrusion is formed of or coated with a water-repellent material.

BRIEF DESCRIPTION OF THE DRAWINGS

The above and other objects, features and advantages of the present invention will become more apparent from the following detailed description when taken in conjunction with the accompanying drawings in which.

DETAILED DESCRIPTION OF THE PREFERRED EMBODIMENT

A preferred embodiment of the present invention will be described herein below with reference to the accompanying drawings. In the following description, well-known functions or constructions are not described in detail since they would obscure the invention in unnecessary detail.

Figure 4A:
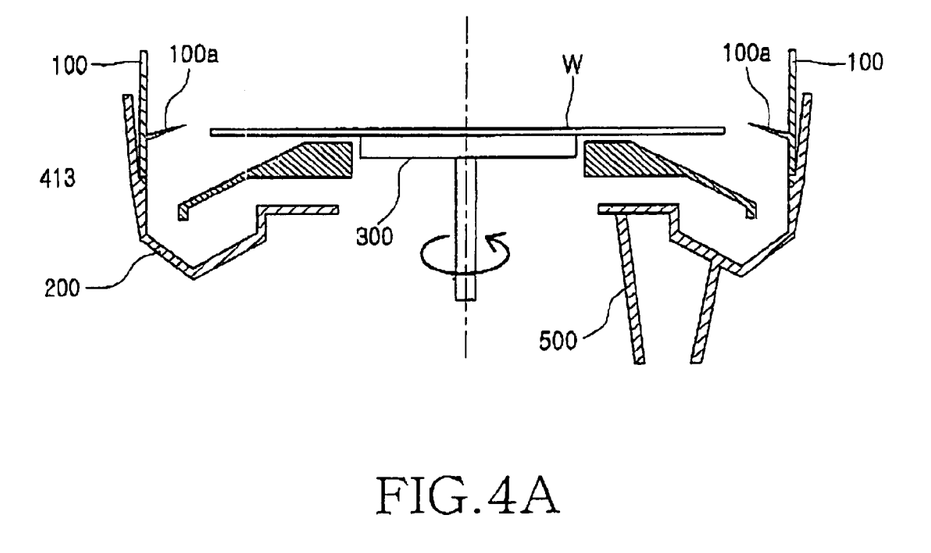
FIGS. 4A and 4B are sectional views illustrating major parts of a substrate surface processing apparatus according to an embodiment of the present invention.
Figure 4B:
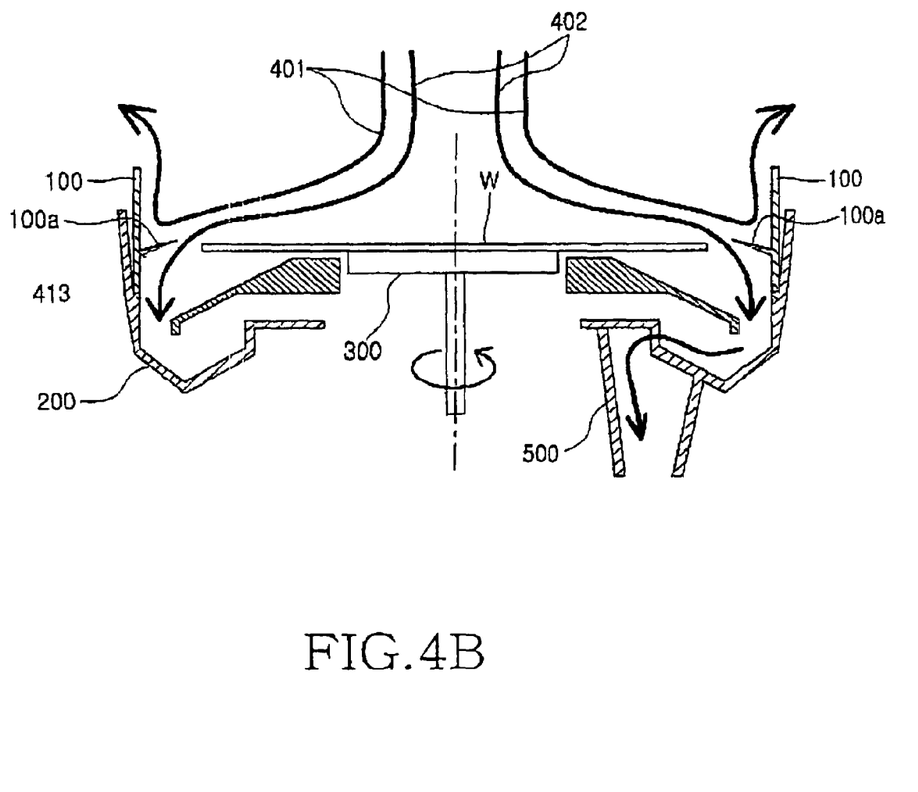

FIGS. 4A and 4B are sectional views illustrating major parts of a substrate surface processing apparatus according to a preferred embodiment of the present invention. Like the conventional substrate surface processing apparatuses, the substrate surface processing apparatus of the present invention includes a spin chuck 300 for holding a substrate W thereon by suction, for spinning the substrate W, and for moving up and down the substrate W, and upper and lower bowls 100 and 200 surrounding the spin chuck 300, for receiving a photoresist solution. An air outlet 500 is disposed under the lower bowl 200 for exhausting air from the bowls 100 and 200. The air outlet 500 is connected to an air pump (not shown) and air is forcedly exhausted from the bowls 100 and 200 through the air outlet 500 by the operation of the air pump. The substrate surface processing apparatus is further provided with a photoresist solution tank (not shown) and a supply nozzle (not shown) for supplying the photoresist solution onto the substrate W.

The substrate surface processing apparatus spins the substrate W at a high speed, and exhausts air from the bowls 100 and 200 through the air outlet 500 to prevent fine particles of a photoresist solution splashed from and scattered around the substrate W from moving up to the upper bowl 100 and contaminating other devices.

The substrate surface processing apparatus is further provided with a flow separation protrusion 100a having a predetermined shape for controlling a flow in the bowls 100 and 200 around the wafer W to prevent an upstream air flow, which is produced by a low pressure around the substrate W during high-speed spinning of the substrate W, from moving down onto the substrate W.

The flow separation protrusion 100a is ring-shaped around the inner wall of the upper bowl 100. The surface of the flow separation protrusion 100a facing the substrate W is inclined, thereby preventing photoresist particles from bumping into the upper bowl 100 and then dropping down onto the substrate W during coating the substrate W with a photoresist solution. The flow separation protrusion 100a separates the flow upward and downward to minimize an air flow that reflows within the whole bowl. Therefore, particle contamination is prevented, which occurs when the fine photoresist particles fall over the substrate W along the air flow returning from the inner walls of the upper and lower bowls 100 and 200.

Figure 5:
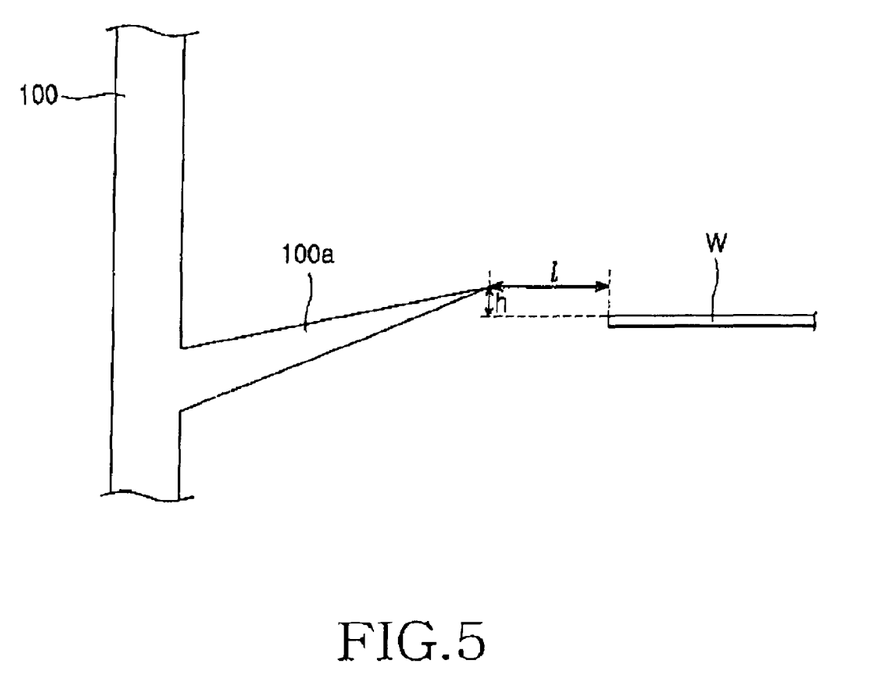
FIG. 5 is a detailed sectional view of a flow separation protrusion illustrated in FIGS. 4A and 4B.

FIG. 5 is a detailed sectional view of the flow separation protrusion 100a illustrated in FIGS. 4A and 4B. Referring to FIG. 5, the lower surface of the flow separation protrusion 100a facing the substrate W is inclined at a predetermined angle against a horizontal surface. The upper surface of the flow separation protrusion 100a is less inclined than the lower surface thereof. The section of the flow separation protrusion 100a is thin triangle-shaped having a vertex facing the outer-diameter edge of the substrate W.

The distance, 1, between the vertex of the flow separation protrusion 100a and the outer-diameter edge of the substrate W is 7 to 11 mm, preferably 8 to 10 mm. The height, h, between the upper surface of the substrate W and the vertex of the flow separation protrusion 100a is 2 to 5 mm, preferably 3 to 4 mm. Therefore, the flow separation protrusion 100a separates the upward and downward air flows 401 and 402 without air reflow. The downward air flow 402 is directed down the lower bowl 200, whereas the upward air flow 401 is directed out the upper bowl 100.

Some photoresist solution scattered from the substrate W contacts the lower surface of the flow separation protrusion 100a and then scatters downward. Therefore, the photoresist solution does not splash back to the substrate W and fine photoresist particles that move along the air flow are removed outside the bowls 100 and 200 without falling onto the substrate W.

Preferably, the vertex of the flow separation protrusion 100a is made as sharp as possible, taking into account of the strength of its material. It is formed of or coated with a water-repellent material such as Teflon to allow the extra photoresist solution, which contacts the flow separation protrusion 100a to effectively slide down the lower surface of the flow separation protrusion 100a. Therefore, the extra photoresist solution will not stick to the flow separation protrusion 100a.

Figure 6:
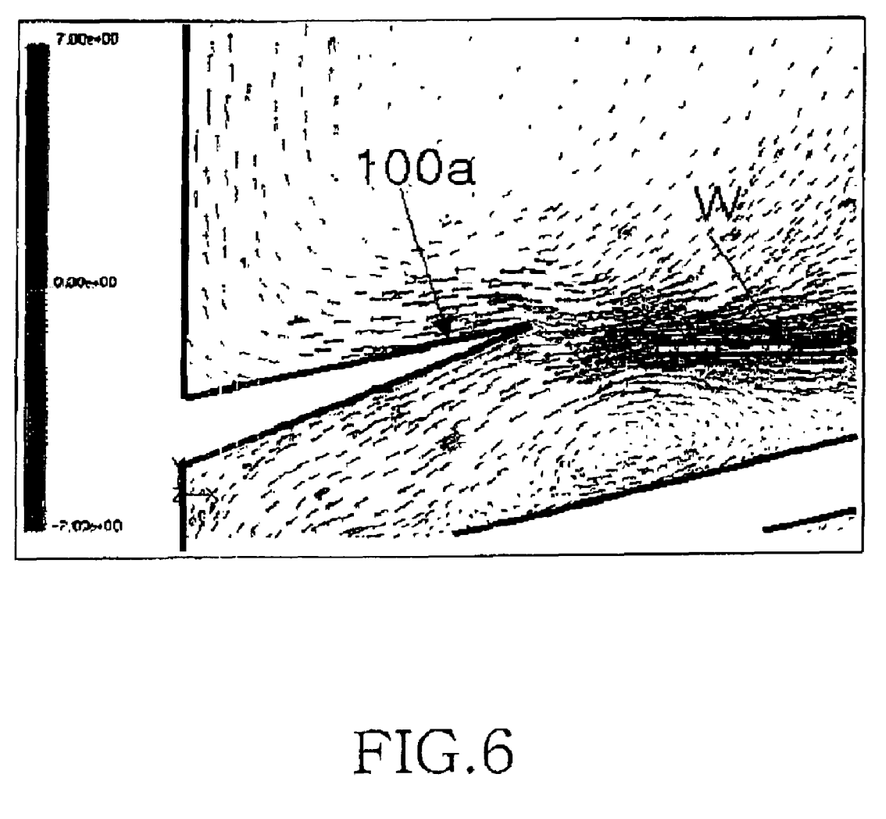
FIG. 6 illustrates the results of a simulation of flow vectors around the flow separation protrusion illustrated in FIGS. 4A and 4B.

FIG. 6 illustrates the result of a computer-aided simulation of air flows and flow vectors around the flow separation protrusion 100a illustrated in FIGS. 4A and 4B. Referring to FIG. 6, the air flow in the vicinity of the substrate W is directed down the lower surface of the flow separation protrusion 100a and then to the air outlet 500. The air flow over the substrate W, as separated by the flow separation protrusion 100a, is directed through the entrance of the upper bowl 100. Although it contains photoresist particles, the air flow in the vicinity of the substrate W is directed to the lower bowl 200 without reflow. Therefore, the extra photoresist scattered due to the spinning of the substrate W is removed through the air outlet 500 without falling onto the substrate W. As a result, the icicle of the photoresist solution occurring in the conventional bowl during coating and particle contamination caused by the splash-back of the photoresist solution are minimized.

Figure 7A:
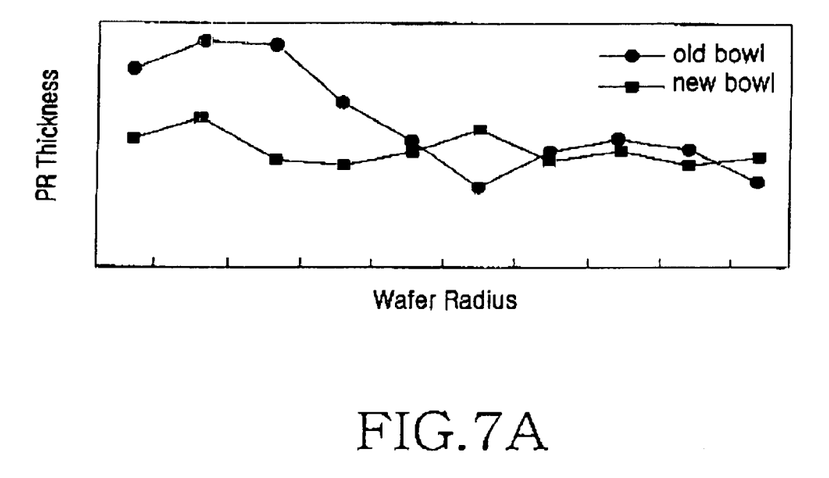
FIGS. 7A and 7B are graphs comparing the substrate surface processing apparatus of the present invention with a conventional substrate surface processing apparatus in terms of performance.
Figure 7B:
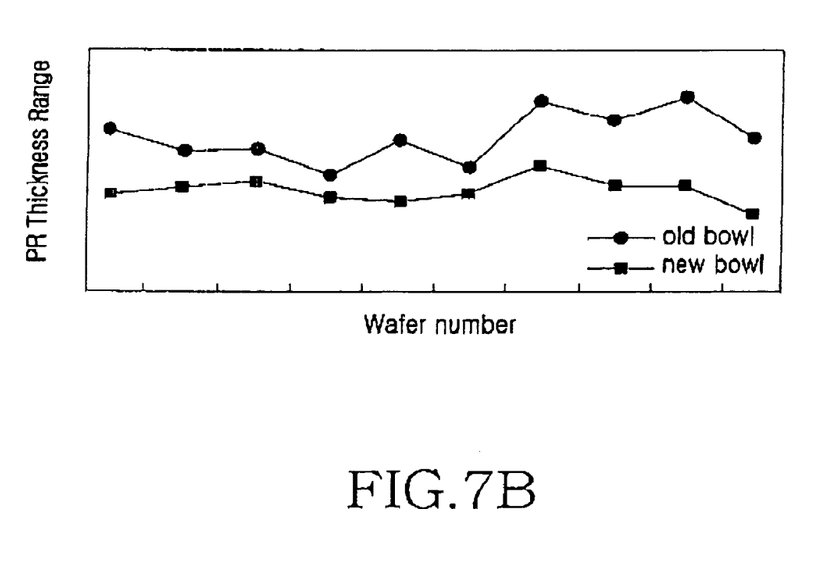

FIGS. 7A and 7B are graphs comparing the substrate surface processing apparatus of the present invention with a conventional substrate surface processing apparatus in terms of performance. The graphs show photoresist (PR) thickness with respect to wafer radius when a substrate is coated with a photoresist solution according to the preferred embodiment of present invention and the conventional technology. Referring to FIGS. 7A and 7B, it is noted that the substrate surface processing apparatus of the preferred embodiment of the present invention solves the problems of the photoresist splash-back and particle contamination thereby making a photoresist layer more uniform on the substrate than the conventional substrate surface processing apparatus. Furthermore, the substrate surface processing apparatus of the present invention effectively reduces the generation of photoresist icicles. Therefore, a bowl cleaning period is considerably increased relative to the conventional technology. For example, the conventional bowl cleaning period is 2 weeks, while it is 4 weeks in the present invention. Consequently, process efficiency is increased.

As described above, the present invention advantageously reduces spin coating rework by eliminating coating failure, that is, particle contamination in photoresist coating using a spin coating apparatus. Therefore, productivity is increased, and the reduction of residual photoresist stuck in a bowl facilitates repair and maintenance.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. A substrate surface processing apparatus comprising:
   a spin chuck for holding a substrate thereon by suction, for spinning the substrate, and for moving up and down the substrate;
   an upper bowl and a lower bowl surrounding the spin chuck for receiving a processing solution by which the surface of the substrate is processed, the upper bowl having an entrance;
   an air outlet under the lower bowl for exhausting air by negative air pressure from the upper and lower bowls; and
   a flow separation protrusion formed within the upper bowl, the flow separation protrusion preventing reflow of an air flow around the substrate by separating the air flow into an upward air flow and a downward air flow, then directing the upward air flow out the upper bowl through the entrance, and directing the downward air flow from the upper bowl through the air outlet,
   wherein the flow separation protrusion is shaped into a ring around an inner wall of the upper bowl, and a section of the flow separation protrusion is so configured that a surface of the flow separation protrusion facing the substrate is inclined at a predetermined angle, an upper surface of the flow separation protrusion is less inclined than a lower surface thereof, and the flow separation protrusion is triangle-shaped having a vertex facing an outer-diameter edge of the substrate.

2. The substrate surface processing apparatus of claim 1, wherein the vertex of the flow separation protrusion is spaced away from the outer-diameter edge of the substrate by a predetermined horizontal distance and spaced above the upper surface of the substrate by a predetermined vertical distance.

3. The substrate surface processing apparatus of claim 2, wherein the flow separation protrusion is formed of a water-repellent material.

4. The substrate surface processing apparatus of claim 2, wherein the flow separation protrusion is formed of a water-repellent material.

5. The substrate surface processing apparatus of claim 1, wherein the flow separation protrusion is formed of a water-repellent material.

6. The substrate surface processing apparatus of claim 1, wherein the flow separation protrusion is coated with a water-repellent material.

* * * * *